United States Patent
Sundström

(12) 
(10) Patent No.: US 6,593,812 B2
(45) Date of Patent: Jul. 15, 2003

(54) AUTOMATIC OPTIMIZATION OF LINEARITY FOR ENVELOPE FEEDBACK RF AMPLIFIER LINEARIZATION

(75) Inventor: Lars Sundström, Lund (SE)

(73) Assignee: Telefonaktiebolaget LM Ericsson, Stockholm (SE)

( * ) Notice: Subject to any disclaimer, the term of this patent is extended or adjusted under 35 U.S.C. 154(b) by 0 days.

(21) Appl. No.: 10/125,347

(22) Filed: Apr. 19, 2002

(65) Prior Publication Data

US 2002/0171484 A1 Nov. 21, 2002

Related U.S. Application Data

(60) Provisional application No. 60/285,239, filed on Apr. 23, 2001.

(51) Int. Cl.$^7$ ............................................. H03G 3/20
(52) U.S. Cl. .................... 330/136; 330/129; 327/307
(58) Field of Search ........................... 330/11, 107, 129, 330/136; 327/307

(56) References Cited

U.S. PATENT DOCUMENTS

| | | | | |
|---|---|---|---|---|
| 3,900,823 A | * | 8/1975 | Sokal et al. | 330/149 |
| 5,144,258 A | * | 9/1992 | Nakanishi et al. | 330/129 |
| 5,886,572 A | | 3/1999 | Myers et al. | |
| 6,112,062 A | | 8/2000 | Hans et al. | |
| 6,252,455 B1 | | 6/2001 | Kurby et al. | |

FOREIGN PATENT DOCUMENTS

EP 1067696 A2 1/2001

OTHER PUBLICATIONS

Ming–Ta Hsieh et al.; A European ISM Band Power Amplifier Module; 4 pages; Department of Electrical and Computer Engineering, University of Minnesota, Minneapolis, MN 55455, USA; RAWCON 2000.2000 IEEE Radio and Wireless Conference (Cat. No. 00EX404); Piscataway, NJ, USA; IEEE, 2000, xiv+265 p. (239–42); RAWCON 2000.2000 IEEE Radio and Wireless Conference (Sep. 10–13, 2000: Denver, CO, USA).

Hiroaki Kosugi et al.; A High–Efficiency Linear Power Amplifier Using an Envelope Feedback Method; Electronics and Communications in Japan, Part 2, vol. 77, No. 3, 1994; pp. 50–57; Translated from Denshi Joho Tsushin Gakkai Ronbunshi, vol. 76–C–1, No. 11, Nov. 1993, pp. 407–413.

Bo Shi et al.; Design and Implementation of a CMOS Power Feedback Linearization IC for RF Power Amplifiers; IEEE 1999; pp. II–252–II–255; Competence Center for Circuit Design, Department of Applied Electronics, Lund University, P.O. Box 118, SE–221 OO Lund, Sweden.

Bo Shi et al.; Linearization of RF Power Amplifiers Using Power Feedback; 1999 IEEE; pp. 1520–1524; Competence Center for Circuit Design, Department of Applied Electronics, Lund University, P.O. Box 118, SE–221 OO Lund, Sweden.

J.S. Cardinal et al.; A New Adaptive Double Envelope Feedback (ADEF) Linearization for Mobile Radio Power Amplifiers; 1994 IEEE MTT–S Digest; pp. 573–576; Microwave Research Laboratory, Electrical and Computer Engineering Department, Ecole Polytechnique de Montreal, University of Montreal, P.O. Box 6079, Station "A", Montreal, Canada.

* cited by examiner

*Primary Examiner*—Henry Choe
(74) *Attorney, Agent, or Firm*—Burns Doane Swecker & Mathis LLP

(57) ABSTRACT

An amplifier configuration and method of amplifying a signal are provided for automatic optimization of linearity of power amplifier input/output characteristics. The amplifier configuration utilizes a feedback loop that includes detecting envelopes of signals that are input and output from a power amplifier. The amplifier configuration includes an offset parameter determined in a second feedback loop that adapts to values for optimizing the linearity of the power amplifier output when input signal amplitudes are within a predetermined range of small signal values, thereby producing a substantially reduced distortion and thus linearized output over the entire input signal amplitude range.

36 Claims, 13 Drawing Sheets

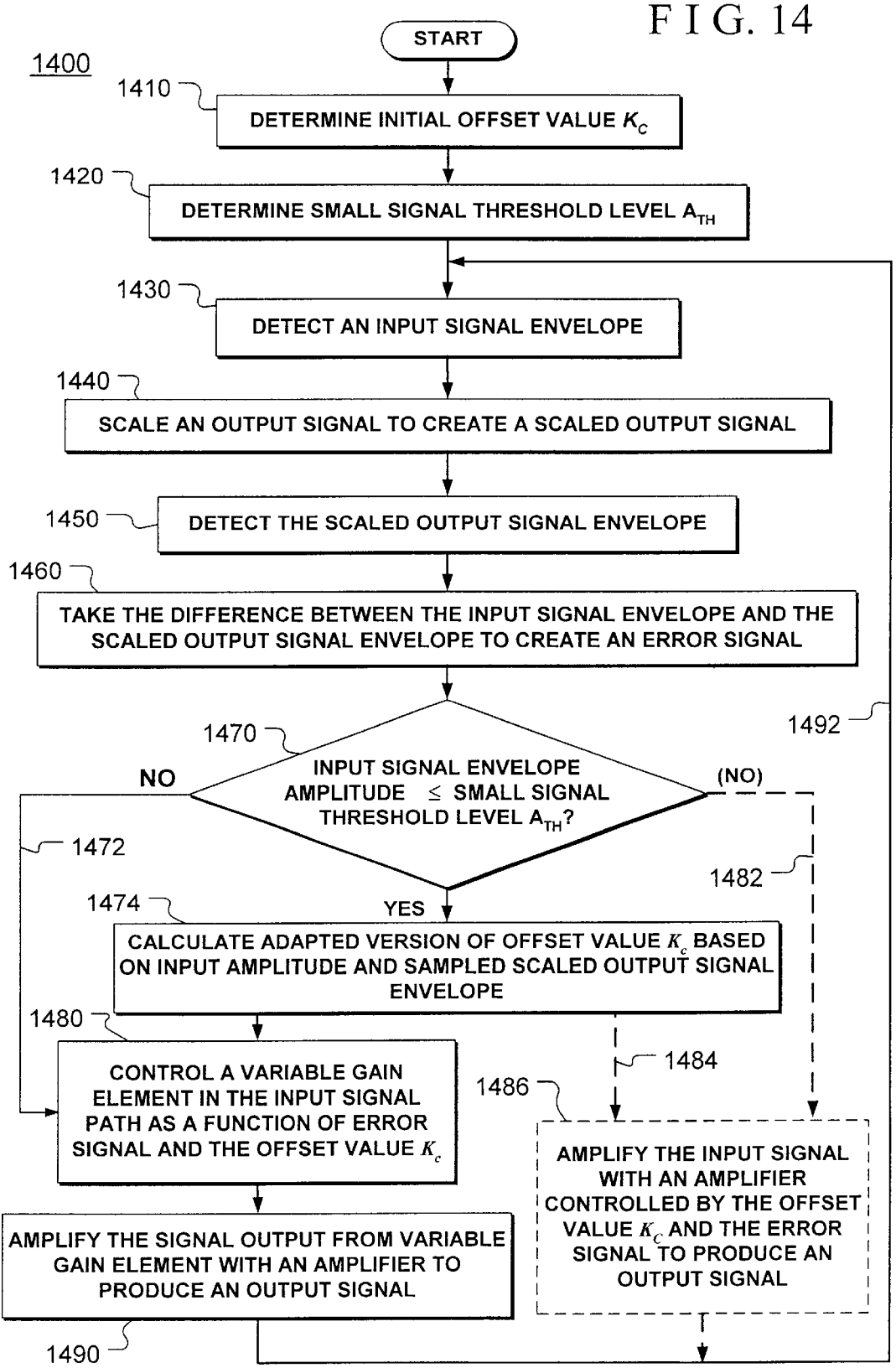

AUTOMATIC OPTIMIZATION OF LINEARITY FOR ENVELOPE FEEDBACK RF AMPLIFIER LINEARIZATION

RELATED APPLICATIONS

This application claims benefit of priority from U.S. Provisional Application No. 60/285,239, filed on Apr. 23, 2001, the entire disclosure of which is expressly incorporated herein by reference.

BACKGROUND OF THE INVENTION

1. Field of the Invention

The present invention relates to amplifiers, and in particular, to efficient power amplifying circuits and methods that compensate for nonlinear distortions produced by a power amplifier between an input signal and an output signal.

2. Description of the Related Art

Amplifiers are used in a variety of applications requiring small signal amplification. Low distortion in amplifier output is of particular importance in applications requiring linear processing or reproduction of signals containing information in the amplitude and phase of a signal. Amplifier output should exhibit low distortion in amplitude and phase to maintain integrity of this information upon amplification. In other words, to maintain high signal fidelity, an amplifier should exhibit a near linear input-to-output characteristic over its operating range.

Linear amplification is of particular importance in communication devices that transmit amplified signals having information encoded in the amplitude and phase of the signal. Signals transmitted from a source to a destination are often modulated and amplified before they are transmitted. Several existing and prospective wireless digital communication systems are based on modulation schemes with both varying amplitude and phase are often referred to as linear modulation schemes. Compared to modulation schemes having only phase or frequency modulation, linear modulation schemes provide higher spectral efficiency for a given throughput (number of bits per Hz per second).

Unfortunately, in a communication device the spectral properties of a signal can only be preserved if the entire transmitter chain is linear. If the transmitter is not linear, intermodulation distortion (IMD) products will be generated in the transmitted signal causing spectral growth of the signal that interferes with users in adjacent channels. If the nonlinearity is particularly strong, signal integrity will be jeopardized and lead to increased bit-error rates in the receiver. However, in practice the output of an amplifier is nonlinear because the output eventually saturates at some value as the amplitude of the input signal is increased. As the amplifier output is driven into saturation, IMD products in the output increase resulting in undesirable distortion.

A traditional method of obtaining linear amplification is to use class A power amplifiers operating far below saturation. However, this type of operation is inefficient since a class A amplifier will dissipate power even with a zero input signal or in a quiescent condition. This is a particularly significant power drain in portable devices operating on battery power.

The power amplifier in a transmitter is the main contributor of distortion because the design is a tradeoff between linearity on one side and power efficiency on the other. Recent attention has been directed to design of power amplifier configurations having linearization circuitry applied to power efficient, but nonlinear power amplifiers to obtain both linear amplification and high power efficiency. One method of achieving increased linearity is by using envelope feedback circuits, such as those disclosed by H. Kosugi et al. in "A High-Efficiency Linear Power Amplifier Using an Envelope Feedback Method," Electronics and Communications in Japan, Part 2, vol. 77, no. 3, 1994, pp. 50–57, and B. Shi et al. in "Linearization of RF Power Amplifiers Using Power Feedback," Proceedings of the 49th IEEE Vehicular Technology Conference, May 1999, pp. 1520–1524, both of which are hereby incorporated by reference.

FIG. 1 shows a block diagram of an RF power amplifier configuration 100 illustrative of the principle of envelope feedback. As shown in FIG. 1, an RF input signal $s_i$ is weighted in a variable gain amplifier (VGA) 124 prior to a nonlinear power amplifier (PA) 128 so as to achieve an overall linear behavior. The weighting is obtained by a feedback circuit provided between an input node 120 on which is impressed an input signal $s_i$ and an output node 130 receiving an amplified reproduction $s_o$ of the input signal $s_i$. Between node 122 and node 130, the input signal $s_i$ is adjusted by amplification or attenuation by the VGA 124. The adjusted signal is output to node 126 and then supplied to PA 128 to produce amplified output $s_o$.

Amplifier configuration 100 includes an envelope feedback circuit to supply a signal for controlling the VGA 124. The feedback circuit includes a first signal path along node 132 and a second signal path along node 133. The output signal $s_o$ is coupled by a coupler 131 from output node 130 to node 132. The decoupled output of $s_o$ is then supplied to a fixed attenuator 134. The fixed attenuator 134 scales the RF output so and defines the linear gain of the topology (assuming a very large loopgain). The scaled output is then provided to regular or power squared envelope detector 136.

The input signal $s_i$ on node 120 is similarly coupled by a coupler 121 to node 133, which in turn is coupled to a regular envelope or squared power envelope detector (D) 135. The detected input and scaled output (regular or power) envelope signals are subtracted in a differencing element 140, such as a difference amplifier, to produce an error signal $r_e$. The error signal is then filtered in loop filter 142, such as a low pass filter (LPF), and amplified in an amplifier 144. Using a summing element 146, an optional preset offset $K_c$ also may be applied to the amplified error signal prior to the control of the VGA 124. The amplified error signal is then provided to control the amplification level of the VGA 124, which conditions the input signal $s_i$ prior to input into the PA 128.

FIG. 2 shows a block diagram of a power amplifier configuration 200 that is illustrative of an alternative to using a VGA to control an output amplitude of a nonlinear power amplifier. Elements with like reference numerals and their corresponding functions are described above. As shown in FIG. 2, the output power of a PA 228 is directly controlled by the error signal $r_e$. In this case, the error signal $r_e$, for example, may control the operating point or the supply power voltage. Direct control of the PA 228, for example, by controlling the operating point, power supply and/or another direct control method, is a way of implementing VGA functionality within the PA.

As discussed below in detail, the linearity in the combined gain of the PA and the VGA may be adversely affected depending on the choice of loop component parameters. Thus, the effect that the loopgain has on the overall gain of the amplifier configurations of FIGS. 1 and 2 merits further investigation.

The techniques described above have the same feedback topology. What does differ between the implementations of FIG. 1 and FIG. 2 is the relationship between the VGA/PA control signal and the output amplitude of the PA. In any case, it can be assumed that this relationship will be more or less nonlinear. Thus, without any loss of generality, it is sufficient to consider the topology in FIG. 1 in the following analysis outlining effects that small and large signals have on the linearity of the PA in either feedback configuration.

With respect to the detectors 135 and 136, either regular envelope detectors or power detectors have been proposed. Starting with the envelope detector and considering the DC characteristics of the loop (i.e., disregarding the loop filter), the complex baseband equivalent of an ideal envelope detector is the absolute value (a real value) of a complex valued signal. Thus, $$D(s_x) = |s_x| = r_x \quad \text{(equation 1),}$$

and for this case the output amplitude is given by $$r_o = \frac{A_G(K_c + A_c r_i)}{1 + A_G A_c r_i \beta} \cdot r_i. \quad \text{(equation 2)}$$

With $A_G A_c \beta r_i \gg 1$, where $A_G A_c \beta r_i$ may be defined as the loopgain of the system, and for $A_G A_c r_i \gg K_c$, the output amplitude is given by $$r_o \approx \frac{r_i}{\beta}, \quad \text{(equation 3)}$$

where $1/\beta$ may be defined as the linear gain of the system.

Note that the loopgain is proportional to the input signal amplitude. Thus, the condition $A_G A_c r_i \beta \gg 1$ will only be valid for a limited input amplitude range. After inspection of equation 2, the offset may be chosen as $$K_c = \frac{1}{\beta A_G}, \quad \text{(equation 4)}$$

which also results in $$r_o \approx \frac{r_i}{\beta}. \quad \text{(equation 5)}$$

The forgoing analysis has not considered the fact that $A_G$ is a nonlinear function that is dependent on the input signal amplitude. However, if the PA 128 is linear for small input signals, $K_c$ may be set to $$K_{c0} = \frac{1}{\beta A_{G0}}, \quad \text{(equation 6)}$$

where $A_{G0}$ is the small-signal gain of the PA 128. Thereby, linear operation with desired gain will be obtained over the range for which the PA 128 is linear. Beyond this range, the loopgain must be sufficiently large (according to the discussion above) to give a linear PA 128 over the full range of input amplitudes.

This reasoning also applies when using power detectors. With $$D(s_x) = |s_x|^2 = r_x^2 \quad \text{(equation 7),}$$

the output amplitude becomes $$r_o = \frac{1}{\beta} \cdot \left( -\frac{1}{2 A_G A_c \beta r_i} + \sqrt{\left(\frac{1}{2 A_G A_c \beta r_i}\right)^2 + \frac{K_c}{A_c} + r_i^2} \right), \quad \text{(equation 8)}$$

and equation 6 still applies to obtain the desired gain for small input amplitudes, whereas the loopgain $A_G A_c \beta r_i$ must be large beyond the small-signal range. The loopgain referred to above is the large signal loopgain, which is useful when considering the linearity of the system. From a stability point of view (as it is a feedback system) the differential loopgain should be considered.

A convenient way of extending the linear range of the topologies discussed above is setting the optional offset $K_c$ to a proper value according to equation 6. However, as discussed below in more detail, if $K_c$ does not have a correct value, the topologies will become nonlinear for small input signals even if the PA 128 is ideally linear.

Another way to extend the linear range of the foregoing topologies would be to increase the loopgain $A_G A_c \beta r_i$ instead of setting offset $K_c$ to a desired value, as the latter may not be well defined. However, increasing $A_G A_c \beta r_i$ would come at the expense of a reduced maximum bandwidth because the product of the loopgain, the loop bandwidth and the loop delay determines the phase margin of the feedback system. Thus, a reduction in loopgain can be traded for an increased bandwidth. Consequently, for a given bandwidth there exists a maximum loopgain which may result in insufficient loopgain for low input amplitudes. Therefore, to optimize the bandwidth, $K_c$ must be set to its proper value.

Unfortunately, there is a problem in setting a value for $K_c$, once and for all, because the small signal gain of the power amplifier is not sufficiently accurate. Hence, there is a need for an adaptive approach to setting the value of $K_c$ to account for such variations.

The effects of various amplifier parameters values are now described. FIG. 3a shows the effect that the feedback loop has on gain ($r_o/r_i$) for a PA linearization configuration having a regular envelope detector and using the following parameters: $A_G=10$; $\beta=0.1$; $0 \leq r$, $\leq 1$; and $K_c=0$. Similarly, FIG. 3b shows the gain for a PA linear configuration with the same parameter values, but using power detectors instead of regular envelope detectors. In both of FIGS. 3a and 3b, a linear PA is assumed to simplify evaluation of the region where the loopgain becomes low and where the PA should otherwise be linear. The parameter $K_c$ was set to zero while the gain $A_c$ of amplifier 144, which basically constitutes the peak loopgain of these configurations, was set to various values to demonstrate the poor behavior of the loop for low input amplitudes.

As shown in FIGS. 3a and 3b, when no offset $K_c$ is provided in the feedback loop, very large values of $A_c$ may be required to obtain a constant gain for a reasonable input signal amplitude range. However, in most cases, such high values of $A_c$ will not be required to compensate for the PA nonlinearities in the saturation region. In addition, $A_c$ should be kept as low as possible, as discussed above, to maximize the bandwidth (without violating stability conditions) of the loop, and thus allow for larger signal bandwidths.

Next, the effects of various values of offset $K_c$ with the gain $A_c$ fixed at 10 are shown in FIGS. 4a and 4b for the linearization configuration of FIG. 1 using regular envelope detectors and power envelope detectors, respectively. As can be seen from FIGS. 4a and 4b, a high degree of accuracy is required for setting offset $K_c$. Note that the gain for zero input signal amplitude always equals $K_c \cdot A_{G0}$.

In FIGS. 5a and 5b, a simple nonlinearity is introduced to model a typical AM—AM saturation characteristic of a PA. The saturation characteristic is given by the following third-order real-valued polynomial:

$$r_{o,pa} = 10 \cdot \left(1 - \frac{4}{27} \cdot r_{i,pa}^2\right) \cdot r_{i,pa}, \quad \text{(equation 9)}$$

where $r_{o,pa}$ is the amplitude of the signal output from the power amplifier and $r_{i,pa}$ is the amplitude of the signal input to the power amplifier. In the characteristic defined by equation 9, the output $r_{o,pa}$ saturates for $r_{o,pa}=10$ and provides a small-signal gain of $A_{G0}=10$. As shown in FIGS. 5a and 5b, the gain for the loop with envelope and power detectors, respectively, are shown for various setting of $K_c$ and $A_c$. The special case with $K_c=K_{c0}$, $A_c=0$ corresponds to the gain of the PA alone.

The plots of FIGS. 3a to 5b show that offset $K_c$ is just as important a parameter as the loopgain in the feedback system. As shown for small signal amplitudes in FIGS. 3a and 3b, a high loopgain can never make up for an incorrectly set offset $K_c$ because the loopgain is proportional to the input signal and steadily drops with decreasing input signal amplitude. Thus, the offset $K_c$ must be set accurately in an envelope feedback system to avoid distortion of the small signal portion of the input range.

SUMMARY

Accordingly, the present invention is directed to automatic optimization of linearity of envelope feedback RF amplifier linearization that substantially obviates one or more of the problems due to the limitations and disadvantages of the related art.

In one aspect of the present invention, an amplifier configuration includes a power amplifier having a feedback loop for linearizing the power amplifier output. The feedback loop includes an offset value that is combined with an error signal that is a function of the input and output signal amplitudes and generated in the loop. If the input signal amplitude of the amplifier configuration is at or below a predetermined small signal value, the value of the offset parameter is adaptive to changes between the amplitudes of the input and output signals to linearize the power amplifier within this range. When amplitudes of the input signal are above the predetermined small signal threshold level, the offset value is maintained at a constant predetermined offset signal value.

Additional aspects and advantages of the invention will be set forth in the description that follows, and in part will be apparent from the description, or may be learned from practice of the invention. The aspects and advantages of the invention will be realized and attained by the system and method particularly pointed out in the written description and claims hereof as well as the appended drawings.

It is to be understood that both the foregoing general description and the following detailed description are exemplary and exemplary only and are not restrictive of the invention, as claimed.

It should be emphasized that the terms "comprises" and "comprising," when used in this specification, are taken to specify the presence of stated features, integers, steps or components; but the use of these terms does not preclude the presence or addition of one or more other features, integers, steps, components or groups thereof

BRIEF DESCRIPTION OF THE DRAWINGS

The accompanying drawings, which are included to provide a further understanding of the invention and are incorporated in and constitute a part of this specification, illustrate embodiments of the invention that together with the description serve to explain the principles of the invention. In the drawings:

FIG. 14 is a flowchart of an exemplary method of amplifying a signal in accordance with an eighth embodiment of the present invention.

DETAILED DESCRIPTION

These and other aspects of the invention will now be described in greater detail in connection with a number of exemplary embodiments that are illustrated in the accompanying drawings.

One drawback with setting the offset $K_c$ to a preset constant value is that an amplifier and other amplifying system components are subject to time drifts, thermal drifts and drifts produced by a fluctuating voltage supply, as well as manufacturing variations in the system components and adverse environmental operating conditions. These variations in turn cause imprecise and/or variations in small signal gain $A_{G0}$ of a power amplifier. Thus, inaccuracies in a preset offset value $K_{c0}$ result in undesirable nonlinearities.

Accordingly, the present invention is directed to automatic optimization of linearity for envelope feedback RF amplifier linearization that substantially obviates one or more of the problems due to the limitations and disadvantages of the related art. The general approach of the present invention is to allow offset value $K_c$ to adapt to an optimal value when the input signal amplitude is within a small signal amplitude range.

With the present invention, the error caused by an incorrect value of $K_c$ may be detected for low input amplitudes where a power amplifier is sufficiently linear such that the error originating from the power amplifier nonlinearity can be regarded as insignificant compared with the error originating from the incorrect value of $K_c$. Thus, the present invention can ensure that $K_c$ is properly set by detecting the error for small input signal amplitudes at or below a certain threshold level and this error can be used in various ways to control the value of $K_c$.

The present invention is useful in electronic equipment requiring substantially linear amplification, such as in portable radio communication equipment. The term portable radio communication equipment, hereinafter referred to a mobile radio terminal, includes all equipment such as mobile telephones, pagers, communicators (e.g., electronic organizers, smartphones) and the like. The present invention is particularly useful in systems requiring low signal amplitude distortion of modulated signals, such as in systems including communication transmitters that transmit signals that have been modulated to include information in their amplitudes. Any of the feedback techniques of the present invention can be used alone to compensate for amplitude to amplitude distortion in power amplifiers or in combination with a phase feedback loop for complete correction of power amplifier nonlinearities, for example, in communication systems using Quadrature Phase Shift Keying (QPSK) modulation schemes. Of course, the present invention also may be used to achieve a linearized amplifier signal output over a desired input signal range in applications that are not directly related to portable radio communication system components.

Figure 6:
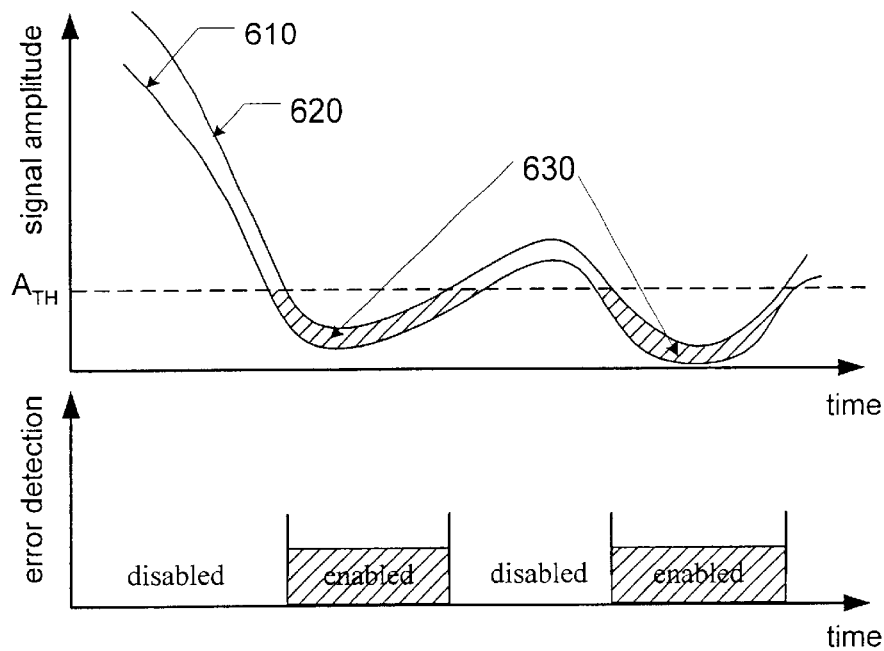
FIG. 6 shows a graphical representation illustrative of general detection and control principles in accordance with the present invention.

With reference to FIG. 6, a generalized method of controlling an offset value $K_c$ in accordance of the present invention is now described. Signal 610 and signal 620 are respectively representative of a detected output envelope and a detected input envelope of a linearized amplifier in accordance with the present invention. The vertical separation distance between signal lines 610 and 620 at a point of time represents an error in the output signal caused by erroneous $K_c$. As shown in FIG. 6, when the amplitude of input signal 620 reaches or drops below amplitude threshold level $A_{TH}$, during time periods 630, error detection in the amplifier system enables control of $K_c$. As will be apparent from the following detailed embodiments, this enabling function may by utilized in a variety of ways to adjust the offset amount $K_c$. Thus, the present invention can detect the error for small input amplitudes and use this error in various ways to control the value of $K_c$ as exemplified in the following embodiments.

Figure 7:
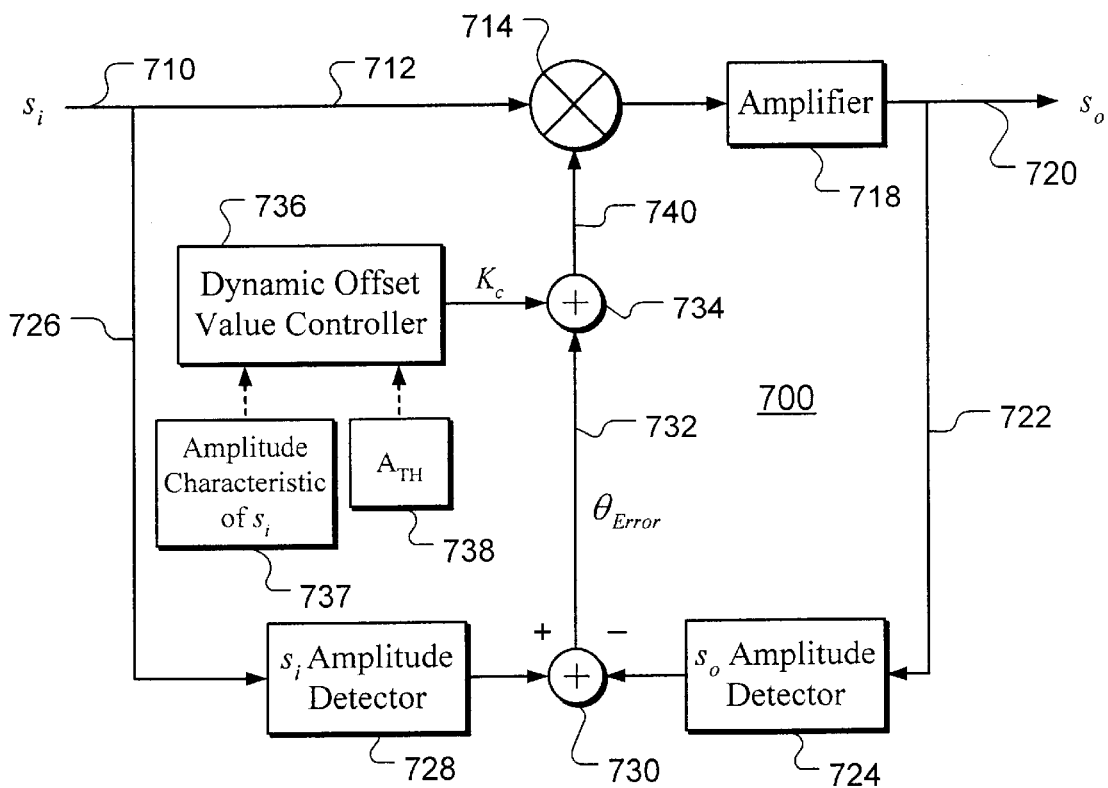
FIG. 7 shows a diagram of an exemplary envelope amplifier in accordance with a first embodiment of the present invention.

FIG. 7 shows a block diagram of an exemplary amplifier configuration 700 in accordance with a first embodiment of the invention that is illustrative of the principles of adaptive offset value. As shown in FIG. 7, an RF input signal $s_i$ is weighted in a variable gain element 714 prior to a nonlinear amplifier 718 so as to achieve overall linear behavior. The weighting is obtained by a feedback circuit provided between an input node 710 on which is impressed an input signal $s_i$ and an output node 720 receiving an amplified reproduction $s_o$ of the input signal $s_i$. Between node 710 and node 720, the input signal level is adjusted via amplification or attenuation by variable gain element 714. The adjusted input signal output of the variable gain element 714 is then supplied to the amplifier 718.

Amplifier configuration 700 includes a feedback circuit to supply a signal for controlling the variable gain element 714. The feedback circuit includes a first signal path along node 722 and a second signal path along node 726. The output signal $s_o$ is supplied to an input of the amplitude detector 724. Along the path at the input side, the input signal $s_i$ on node 710 is supplied to an input of the amplitude detector 728.

Types of amplitude detectors 724, 728 may include, for example, a regular or power envelope detector, such as the envelope detectors described above, or other types of monitors/detectors, such as those including analog and/or digital components. The detected input and output amplitude signals are subtracted in a differencing element 730, such as a difference amplifier, to produce an error signal $\theta_{Error}$ on node 732. The error signal $\theta_{Error}$ is summed in a summing element 734 with an offset value $K_c$. The composite signal from summing element 734 is supplied to node 740, which is connected to variable gain element 714 that conditions the input signal $s_i$ prior to input into the amplifier 718.

Figure 1:
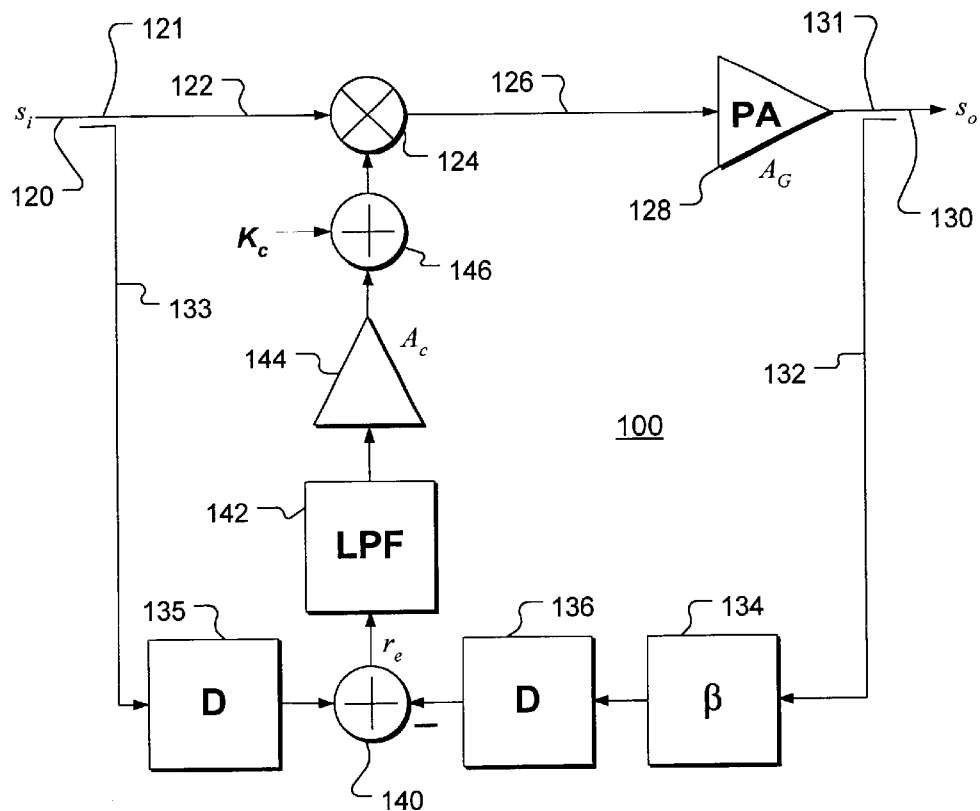
FIG. 1 is a block diagram showing a first amplifier configuration illustrative of the principle of envelope feedback.
Figure 2:
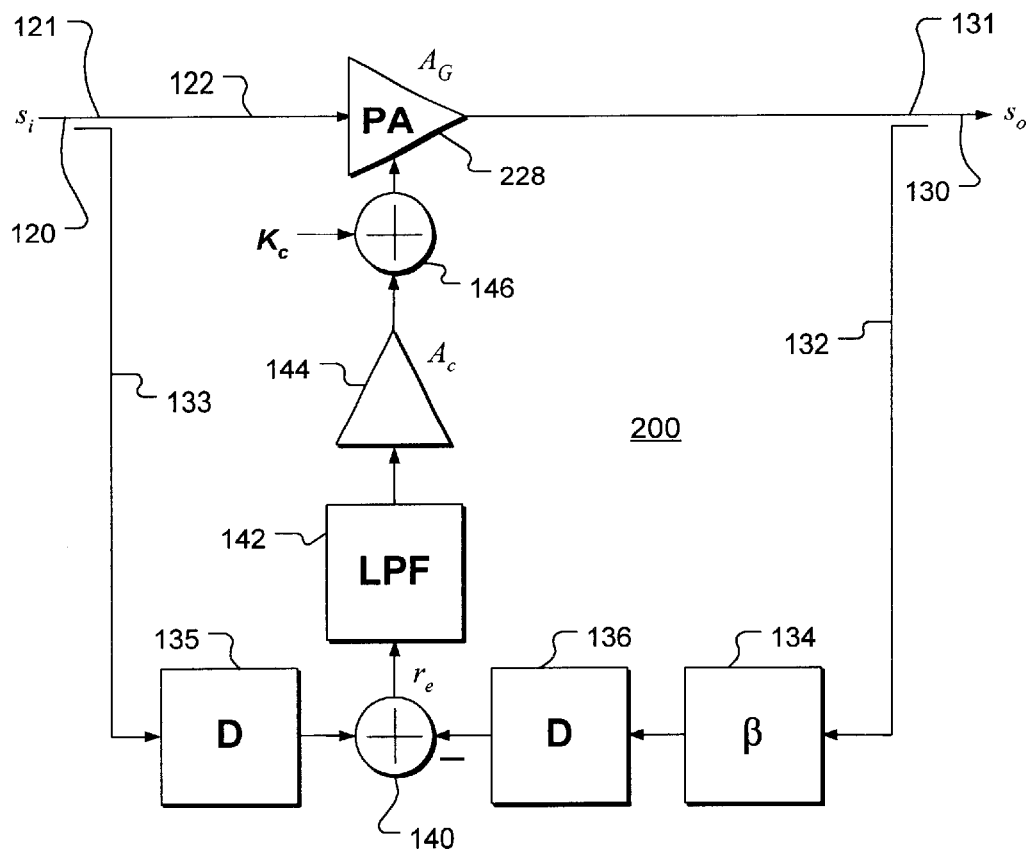
FIG. 2 is a block diagram showing a second amplifier configuration illustrative of the principle of envelope feedback.
Figure 3A:
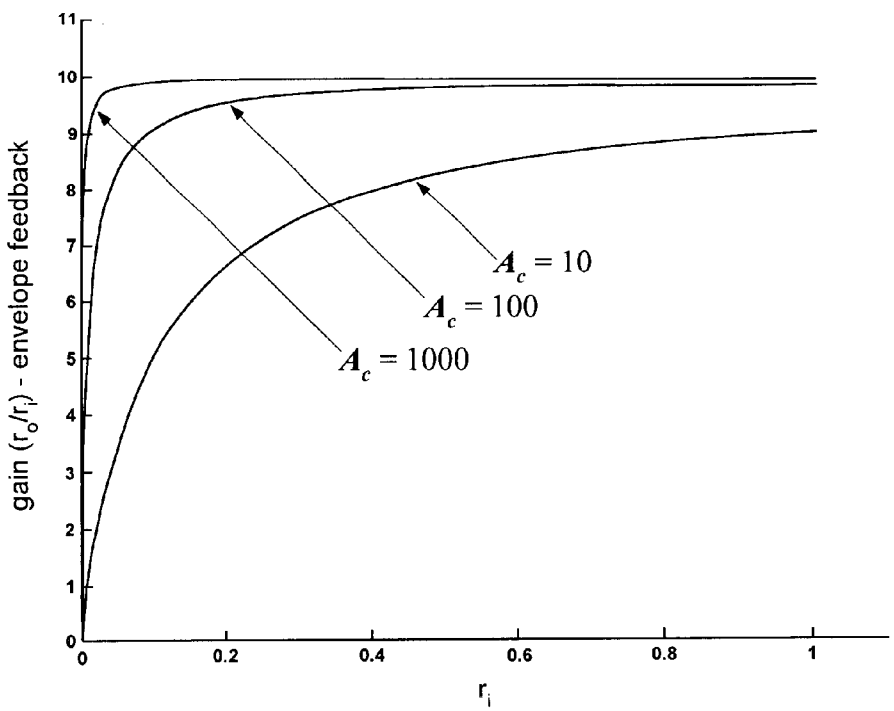
FIG. 3a is a graph showing the variation of amplifier gain versus amplifier input amplitude for various loop amplifier parameters for the amplifier configuration shown in FIG. 1 when the offset parameter equals zero.
Figure 3B:
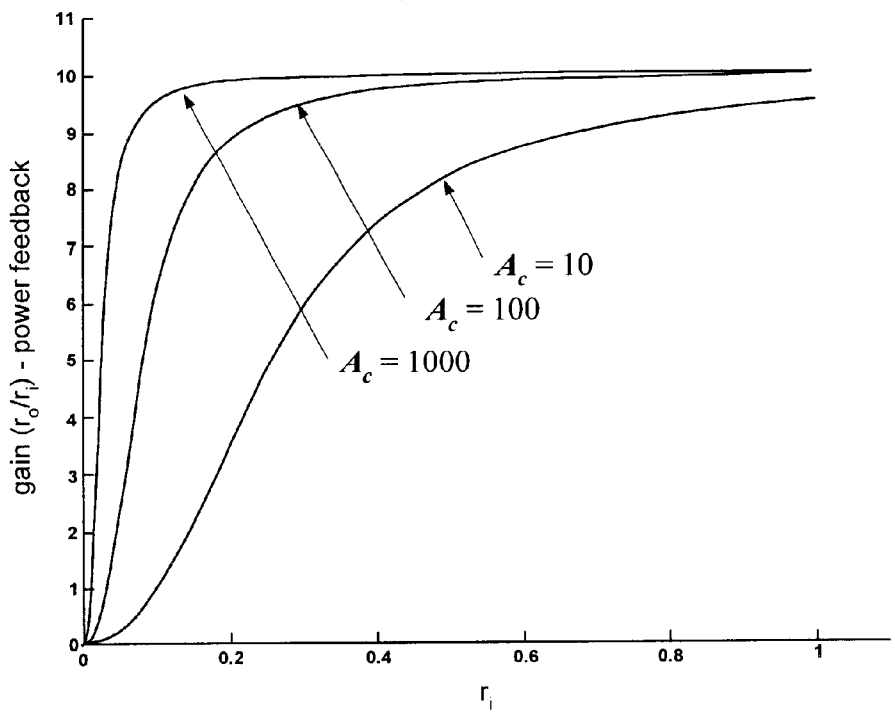
FIG. 3b is a graph showing the variation of amplifier gain versus amplifier input amplitude for various loop amplifier parameters for the amplifier configuration shown in FIG. 2 when the offset parameter equals zero.
Figure 4A:
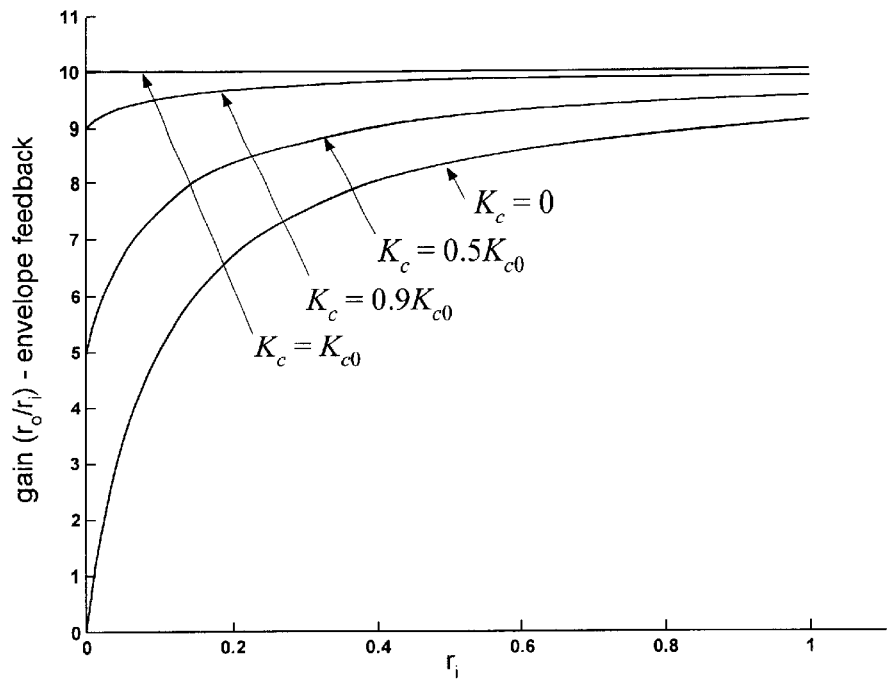
FIG. 4a is a graph showing the variation of amplifier gain versus amplifier input amplitude for the amplifier configuration shown in FIG. 1 when the offset parameter is varied and the loop amplifier gain is fixed.
Figure 4B:
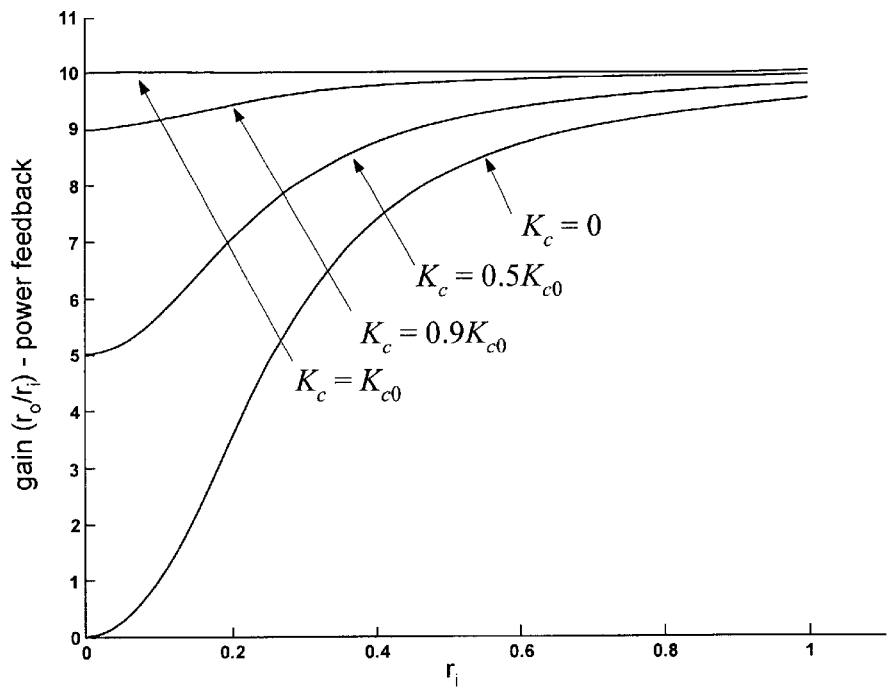
FIG. 4b is a graph showing the variation of amplifier gain versus amplifier input amplitude for the amplifier configuration shown in FIG. 2 when the offset parameter is varied and the loop amplifier gain is fixed.
Figure 5A:
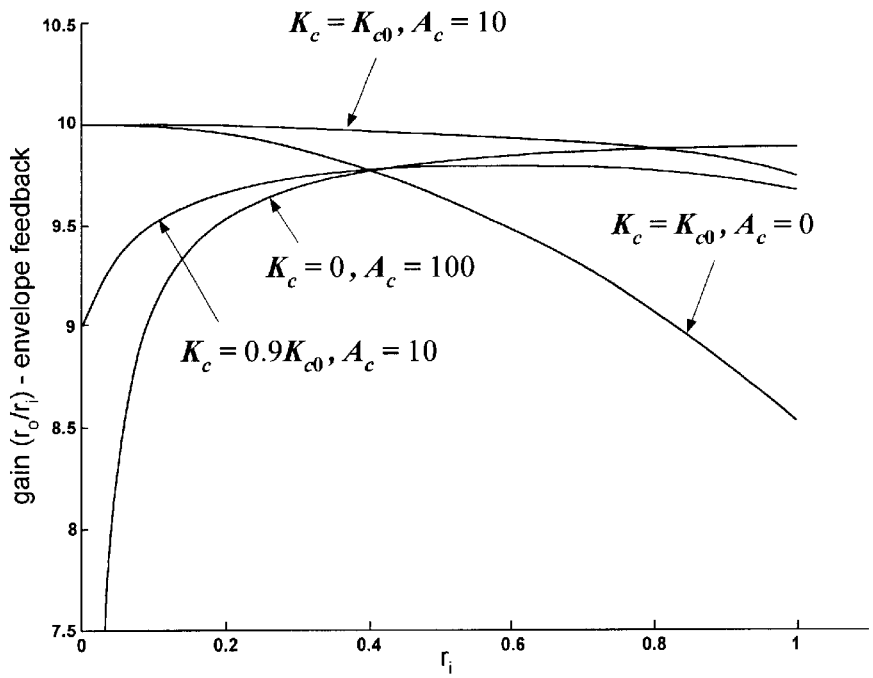
FIG. 5a is a graph showing the variation of amplifier gain versus amplifier input amplitude for the amplifier configuration shown in FIG. 1 when the offset parameter and the loop amplifier gain are varied and the power amplifier is modeled with an AM—AM saturation characteristic.
Figure 5B:
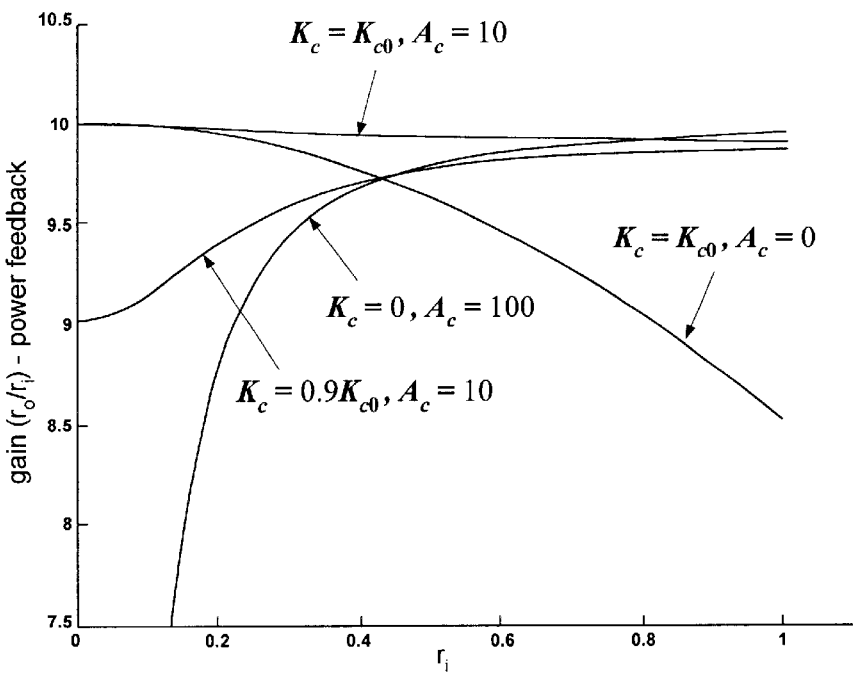
FIG. 5b is a graph showing the variation of the gain versus amplifier input amplitude for the amplifier configuration shown in FIG. 2 when the offset parameter and the loop amplifier gain are varied and the power amplifier is modeled with an AM—AM saturation characteristic.

Unlike the amplifier configurations shown in FIGS. 1 and 2 that utilize a constant preset offset value for all signal levels of $s_i$, the amplifier configuration 700 includes a dynamic offset value controller 736 to supply an offset value $K_c$ that may vary depending on a small signal threshold value $A_{TH}$ 738, such as shown in FIG. 6, for example, and an amplitude characteristic of $s_i$ 737. The small signal threshold value $A_{TH}$ may be a predetermined amount, such as one that is set to a constant value for a particular amplifier configuration. Alternatively, $A_{TH}$ may be adjustable, such that the value may be adjusted depending on particular operating environments. Instead of using a set threshold $A_{TH}$, dynamic offset value controller 736 may include digital signal processing circuitry that supplies a calculated $K_c$ value based on equations, such as those presented above. As another exemplary alternative, the processing circuitry may utilize a stored value for $A_{TH}$, such that a dynamic calculation of $K_c$ is only performed within a range whose upper limit is defined by $A_{TH}$. The amplitude characteristic of $s_i$ 737 may be used to compare against an $A_{TH}$ amount and is provided by a variety of sources, such as from a detected amplitude regular or power envelope of the input signal $s_i$, baseband circuitry producing or processing the input signal prior to the amplifier 700, or other circuits that monitor and/or measure input signal amplitude characteristics. Although not shown in FIG. 7, dynamic offset value generator 736 may also be supplied with other signal characteristics, such as an output amplitude characteristic, depending on a particular application of the principles of the present invention, as further exemplified in the following embodiments.

Figure 8:
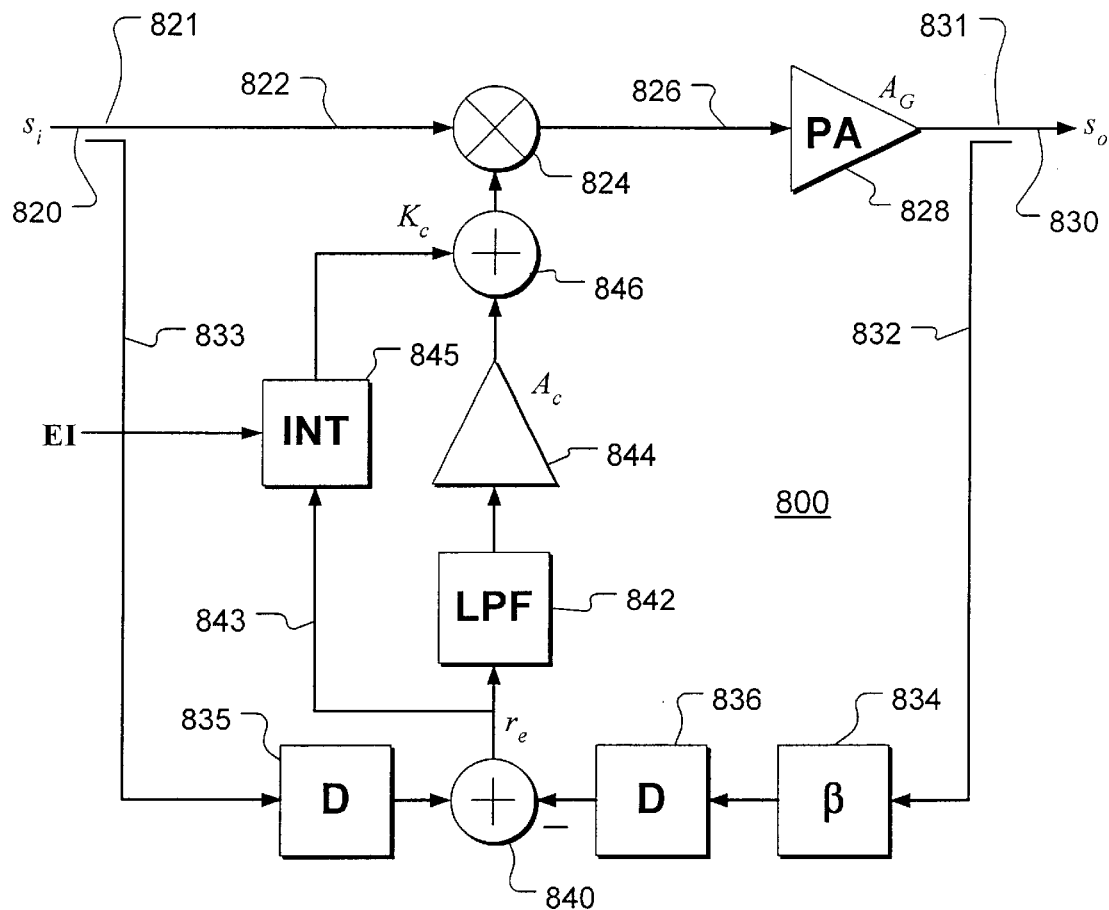
FIG. 8 shows a diagram of an exemplary envelope amplifier in accordance with a second embodiment of the present invention.

FIG. 8 shows a diagram of an exemplary amplifier 800 in accordance with a second embodiment of the invention. Amplifier circuit 800 receives an input signal $s_i$ on input node 820 and produces an output signal $s_o$ along output node 830. The input signal $s_i$ impressed on node 820 can be a signal that is modulated in amplitude and phase, for example, and the output $s_o$ is an amplified reproduction of the input $s_i$. The input signal $s_i$ is coupled by a coupler 821 to a node 833, which in turn is provided to an input of a regular envelope or power (squared) envelope detector 835. The output signal $s_0$ is coupled by a coupler 831 to node 832 and then properly scaled by attenuator 834 before being provided to regular envelope or power (squared) envelope detector 836. While couplers 821 and 831 are schematically shown as distributed line couplers, it is to be understood that any coupling/tapping arrangement may be used to couple/tap a signal from one node to another node, including direct connection of nodes, and/or combinations thereof. Both detected envelope signals are provided to a differencing element 840. Differencing element 840 subtracts one of the detected envelope signals from the other detected envelope signal and generates an error signal $r_e$. Differencing element 840 may be any device capable of outputting a signal indicative of the difference between two input signals. For example, differencing element 840 may be a difference amplifier.

The error signal $r_e$ is then provided to a loop filter (LPF) 842 followed by amplification $A_c$ by amplifier 844 and a summing element 846 that adds offset value $K_c$. The signal output from summing element 846 is then used to control a variable gain element 824, for example, a variable gain amplifier or attenuator, which in turn controls a signal level on node 826, which is an amplified (or attenuated) version of the signal on node 822. The level of the signal $s_o$ supplied by power amplifier (PA) 828 is thus modulated by the feedback signal that controls the variable gain element 824 so as to linearize the output characteristic of the PA 828. Error signal $r_e$ also is applied to node 843 that is coupled to an input of an integrator (IT) 845.

In the present embodiment, the value of $K_c$ is determined by the output of integrator 845 and depends on the value of $r_e$ when the integrator 845 is enabled by an enable signal EI. The integrator 845 should be enabled (e.g., when EI is high) only when the input signal amplitude is within a predetermined integration range. For example, the integration range may be defined as a threshold amplitude $A_{TH}$ as shown in FIG. 6. When signal EI is high, the integrator 845 is enabled and integrates the (regular or power envelope) error signal $r_e$. The enable signal EI can be controlled from the baseband band circuitry of the transmitter, which basically turns on and off the integration function of integrator 845. When not enabled, the integrator retains its value, which basically corresponds to a zero input to the integrator. Thus, the integrator output is kept constant and is equivalent to $K_c$.

It should be readily understood by those skilled in the art that while the input signal amplitude is outside the integration range, $K_c$ should be held constant. By this feedback control structure, the input to the PA 828 is thus either increased or decreased to compensate for amplitude nonlinearities of the PA 828. Thus, the offset value is no longer held at a constant value, such as with the amplifiers of FIGS. 1 and 2, and nonlinear PA output in response to small signal input is compensated based in part on an adaptive offset parameter $K_c$ that may vary when the input signal $s_i$ amplitude is small.

Figure 9:
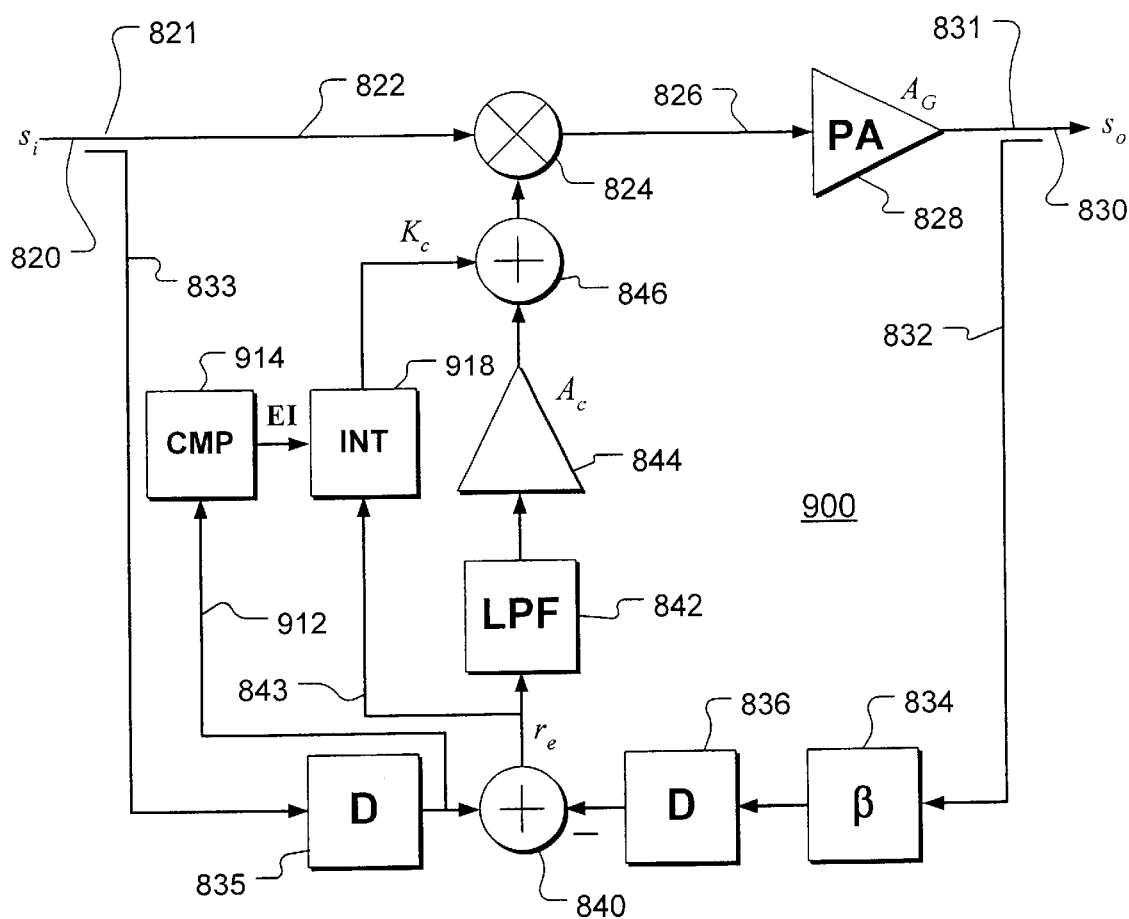
FIG. 9 shows a diagram of an exemplary envelope amplifier in accordance with a third embodiment of the present invention.

The integrator enable signal EI may be derived from sources other than the baseband band circuitry of a transmitter. FIG. 9 shows an exemplary amplifier 900 in accordance with a third embodiment of the present invention in which the EI signal is derived from a comparison of the input signal envelope amplitude with a reference level. The types and functionality of amplifier components shown in FIG. 9 with like reference characters to those of FIG. 8 are described above. As shown in FIG. 9, the detected input signal regular or power envelope is fed into a comparator 914 at node 912. The comparator has a reference level and an integrator 918 is configured to receive an enable signal EI from the comparator 914 when the input signal envelope amplitude is within an integration range, for example, at or below a threshold amplitude $A_{TH}$, as illustrated in FIG. 6.

Since the error signal $r_e$ can be very small, particularly when using power envelope detectors ($r^2$), the gain of the integrator 918 should be sufficiently low to suppress noise and (if present) spurious signals that would otherwise modulate the gain of the system. This in turn means that the feedback loop may be slow. However, this does not present a problem because deviations detected by the loop are mainly slow variations (e.g., due to temperature drift) and/or other static errors in the system.

Because the feedback loop may take some time to converge toward the optimal value for offset $K_c$, a preset function may be incorporated such that the integrator output can be set to a value that is close to the optimal value (i.e., as close as possible with respect to the accuracy of the system) immediately after turning on the power supply.

A practical implementation of the embodiments described above may suffer from an offset in the error signal path. Signal path errors may originate from an imbalance between the two detectors 835, 836. The differencing device 840 also may cause a DC offset. The offset may result in a non-optimal $K_c$. If required, a DC nulling circuit may be provided prior to the integrators 845 and 918 to remove or reduce the offset. For example, a DC nulling circuit may be placed after the differencing device 840 and/or placed after the detectors 835, 836.

Figure 10:
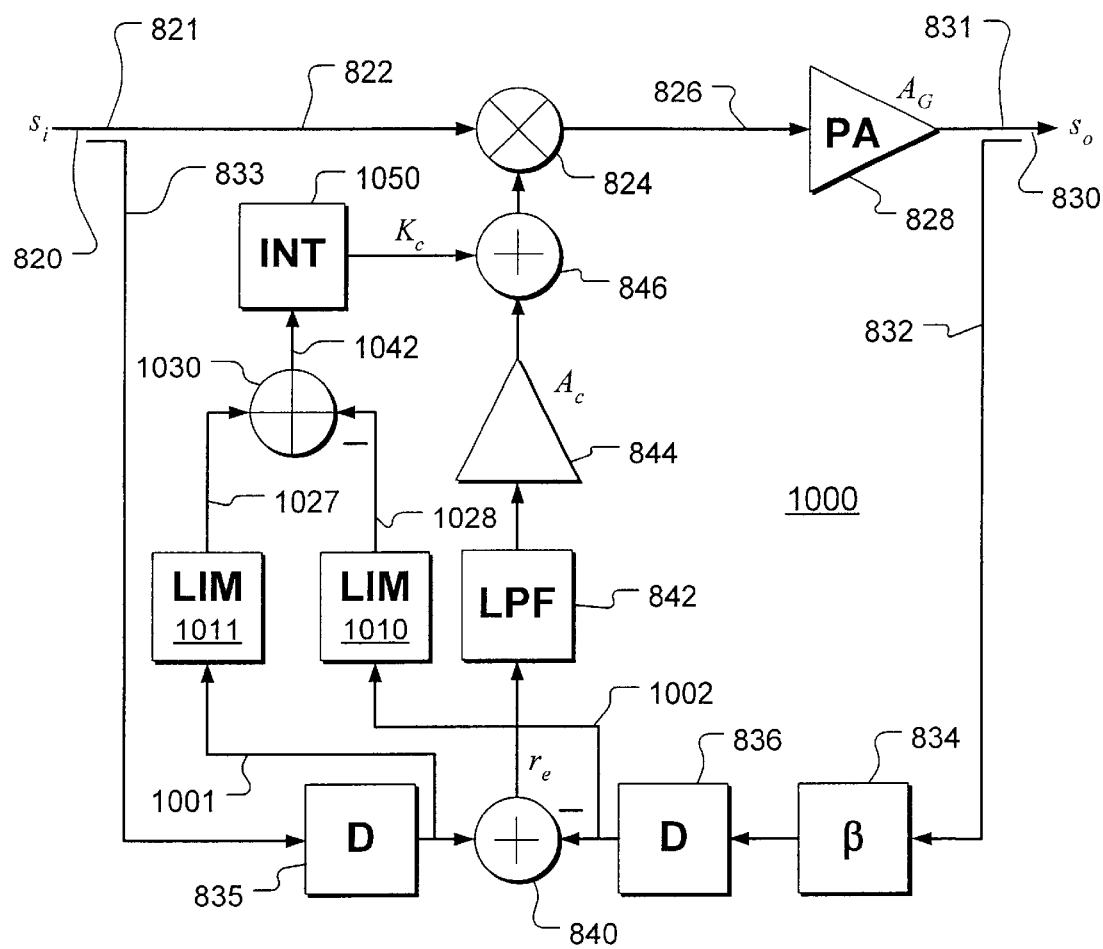
FIG. 10 shows a diagram of an exemplary envelope amplifier in accordance with a fourth embodiment of the present invention.

FIG. 10 shows an exemplary amplifier 1000 in accordance with a fourth embodiment of the present invention. The types and functionality of amplifier components shown in FIG. 10 with like reference characters to the second and third embodiments are described above.

A differencing element 1030, for example, a difference amplifier or the like, receives the output of the limiters 1011, 1010 and the resultant error signal on node 1042 is supplied to an integrator 1050. The gain of limiters 1011, 1010 should be substantially equal and/or set to a value such that input amplitudes beyond the integration range (e.g., above $A_{TH}$) saturates both limiters. Consequently, when input amplitudes are beyond the integration range, the output of the limiters 1010, 1011 on node 1042 will be at the same level, resulting in a zero level error signal, and thus as an input to the integrator 1050 will be zero the integrator output will be constant.

To account for gain and/or offset imbalances between the two limiter paths 1001/1027 and 1002/1028 that may adversely affect the integrator control and result in non-optimal $K_c$, a DC nulling circuit prior to the integrator 1050 can be used to alleviate offset problems. Alternatively or in addition to using a DC nulling circuit, to avoid integration of the offset when the input signal amplitude is outside the integration range, the integrator 1050 can be enabled (EI) only when the input signal is within the integration range, as described above.

Figure 11:
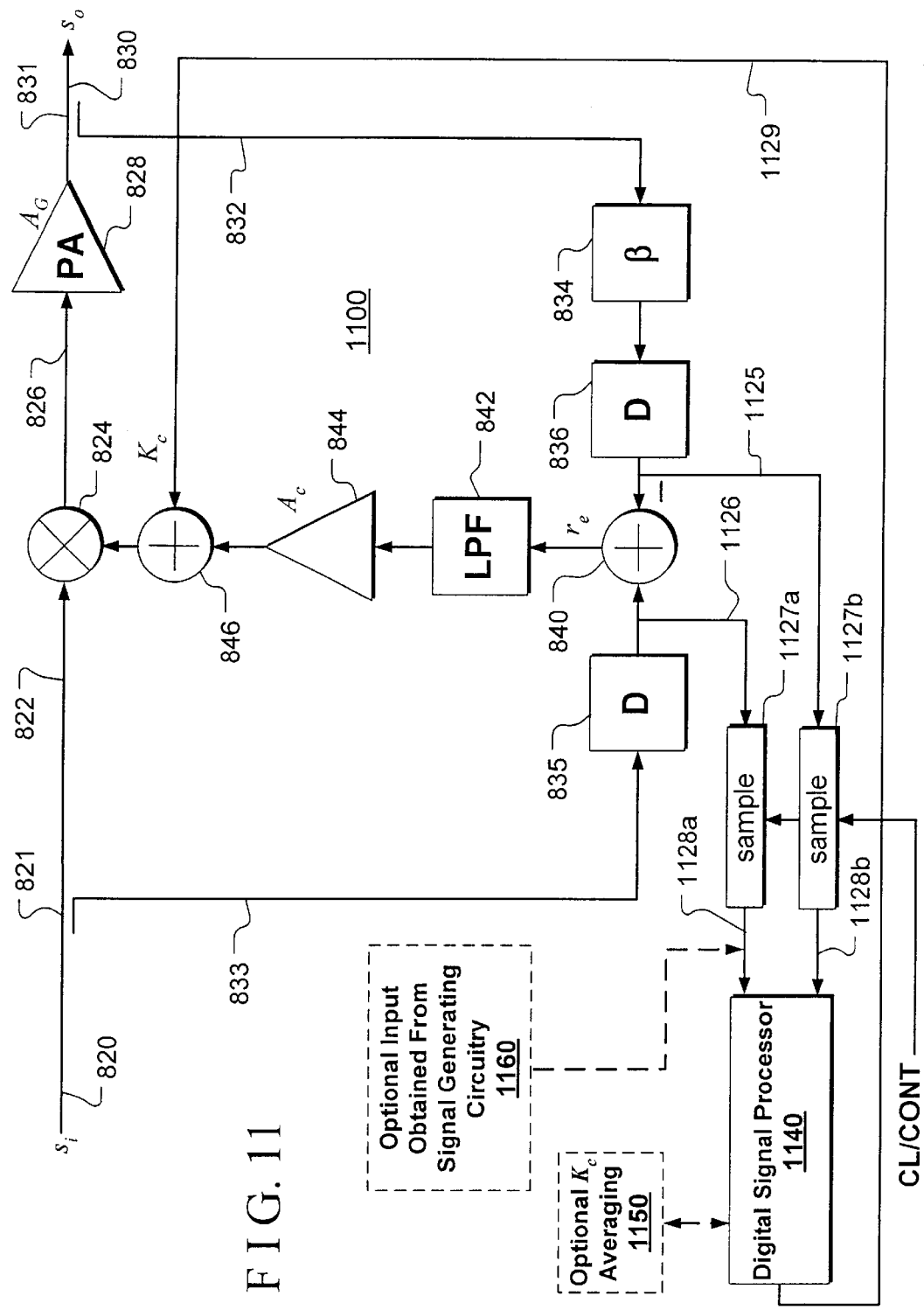
FIG. 11 shows a diagram of an exemplary envelope amplifier in accordance with a fifth embodiment of the present invention.

FIG. 11 shows an exemplary amplifier 1100 in accordance with a fifth embodiment of the present invention. While the foregoing second through fourth embodiments described above rely on deriving $K_c$ by directly integrating the error for input amplitudes below a certain threshold level, amplifier 1100 is based on sampling the detected input and output signals at arbitrary time instances when the input amplitude is below the threshold level $A_{TH}$, calculating the ratio of the two, and then from this, calculating a new value for $K_c$ based on, for example, the respective equations presented above for the regular envelope and power envelope feedback systems.

As shown in FIG. 11, amplifier 1100 includes a feedback loop as in the second through fourth embodiments described above, however, instead of using an integrator for determining offset value $K_c$, amplifier 1100 samples and digitizes the input envelope on node 1126 and the scaled output envelope on node 1125, respectively, by coupling the outputs of detectors 835 and 836 with respective sampling elements 1127a and 1127b, such as analog-to-digital converters (ADCs) that sample and digitize an analog input signal. The sampled and digitized input and output envelope values are output to respective nodes 1128a, 1128b and then are received by a signal processor 1140, such as a digital signal processor, that calculates a new $K_c$ based on the sampled envelope amplitude values. For example, signal processor 1140 may calculate a sampled and digitized input/output ratio and generate a new value for offset $K_c$ based on either equation 2 or equation 8 (respectively depending on whether regular envelope or power envelope detection is used) to maintain a flattened amplifier gain characteristic for small signal input when the digitized input is reaches or falls below the threshold level $A_{TH}$. The signal processor 1140 injects the calculated $K_c$ value onto node 1129, and thereafter the calculated $K_c$ is summed in summing element 846 with the filtered and amplified error signal $r_e$ to thereby control variable gain amplifier 824 and ultimately to affect the amplitude of the signal that is input on node 826 into the power amplifier 828.

Signal processor 1140 may calculate new $K_c$ offset values in a continuous-like fashion by sampling and digitizing input envelope and scaled output envelope values at equidistant time instances using a clock generator to generate a clock signal CL with a fixed frequency. Alternatively, signal processor 1140 may calculate $K_c$ by sampling and digitizing the input and output envelope values at time instances with signal CONT controlled by the signal generating circuitry (not shown). In this case, the sampling time instances for generating signal CONT can be selected, for example, at points where errors are assumed to be small. The errors may be noise and/or offset errors due to delay mismatch between the input signal $s_i$ and the output signal $s_o$. Effects of noise and offset will be prominent when sampling and digitizing very small signal amplitudes and the effect of delay mismatch will be prominent when detecting a signal with a large time derivative, i.e., when the signal amplitude changes quickly with time.

As shown in FIG. 11 by functional block 1150, instead of continuously outputting a new $K_c$ offset value to replace the old value for each sampling interval, an injected $K_c$ value optionally may be based on averaging two or more measurements to finally replace the old value or by calculating a sliding average, i.e., the new value is averaged with the old value with a certain weighting between the two.

In FIG. 11, functional block 1160 represents another optional variation of amplifier 1100. In many amplifier applications requiring linearized amplification, for example, in a communication apparatus, the signal generating circuitry is implemented in the digital domain. Because of this, it may be convenient to calculate the sampled input amplitude from information obtained from the signal generating circuitry instead of sampling and digitizing the detected input envelope from the output of detector 835 on node 1126.

While particular components of amplifiers 800 to 1100 have been described in terms of analog devices, it is to be understood that the functionality of the component building blocks (e.g., D, LPF, INT, etc.) may be analog, digital or both analog and digital, with digital-to-analog and analog-to-digital converters placed as required. Furthermore, while a variable gain amplifier is used in the exemplary embodiments described above, it is to be understood that the PA may be directly controlled by the loop output. It also will be apparent to those skilled in the art that the present invention may be used either alone or in a cascade configuration, as well as including additional components. For example, the input node 826 may include one or more additional amplifying stages, such as driver amplifiers, before the power amplifier 828. While sampling elements 1127a and 1127b are shown as separate elements, it is to be understood that sampling and digitizing elements may alternatively be integrated together in a single device or with the signal processor 1140. While power amplifier 828 is shown as a single unit, it is to be understood that the power amplifier 828 may include multiple amplification stages with the output signal being output from the final stage of the power amplifier 828.

Figure 12:
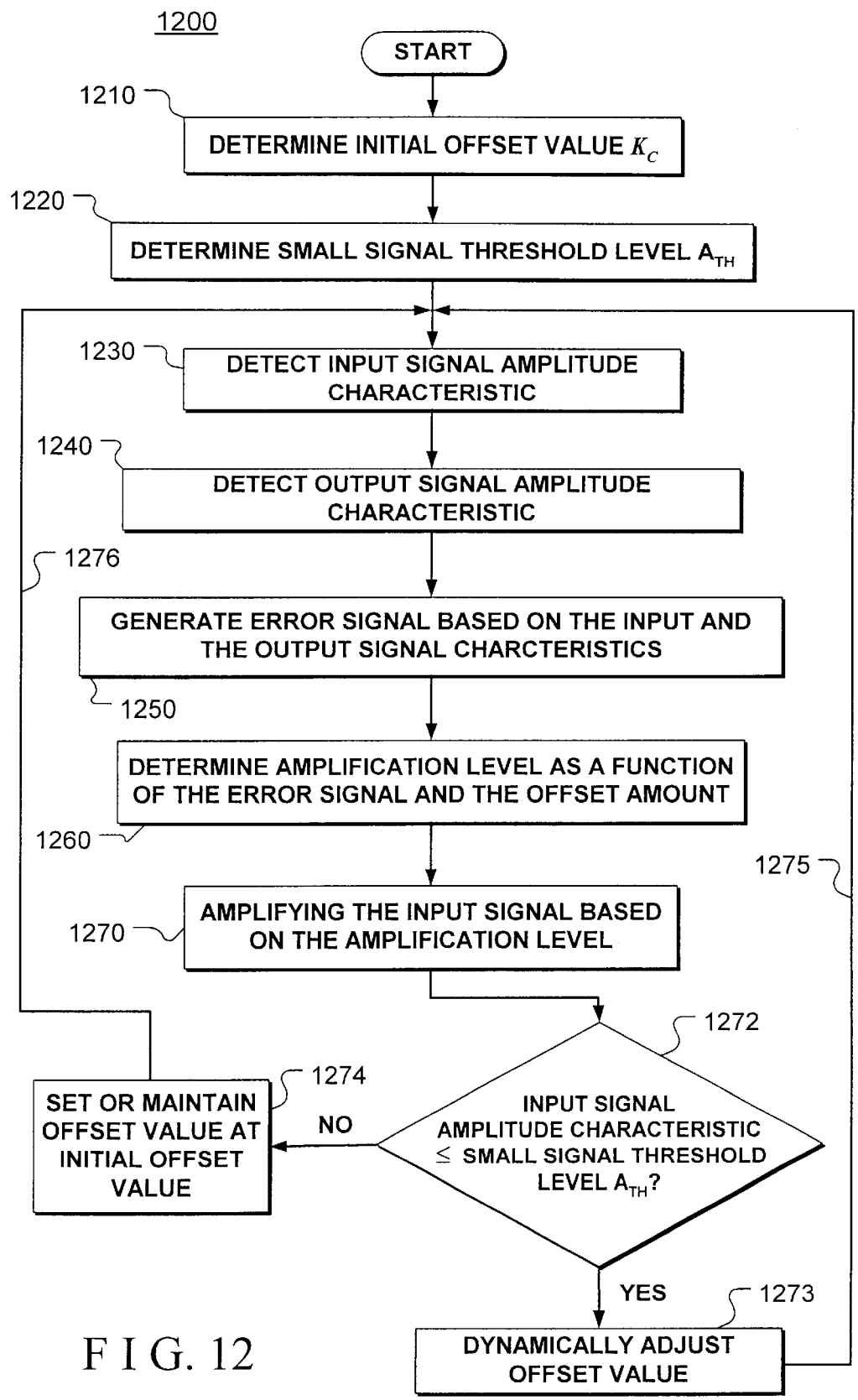
FIG. 12 is a flowchart of an exemplary method of amplifying a signal in accordance with a sixth embodiment of the present invention.

FIG. 12 is a flowchart of an exemplary method 1200 of amplifying a signal in accordance with a sixth embodiment of the present invention. Method 1200 begins in step 1210 when an initial offset value is determined for an amplifying device. For example, the initial $K_c$ value may be set to equal the value indicated in equation 6. However, the initial value of $K_c$ may depend on various factors, for example, an operating temperature or be based on a composite small signal gain if several amplifying stages are present before the amplifier output. In step 1220, a threshold level $A_{TH}$ is determined to define a range in which the small signal gain is nonlinear. In steps 1230 and 1240, input and output signal amplitude characteristics are detected, respectively. The detection of steps 1230 and 1240 may be carried out, for example, using sampling techniques or with envelope detectors, such as the regular or power envelope detectors 835 and 836 described above. In step 1250, a difference is taken between the input amplitude characteristic and the output signal characteristic to create an error signal. In step 1260, an amplification level is determined as a function of the error signal determined in step 1250 and the current offset amount. The input signal is amplified in step 1270 based on the amplification level determined in step 1250. In step 1272 a decision is made as to whether the detected input signal characteristic is less than the small signal threshold level $A_{TH}$. If the detected input signal characteristic is less than the small signal threshold level $A_{TH}$, in step 1272 the offset value $K_c$ is dynamically adjusted (step 1273) to maintain a substantially linear gain characteristic of the amplifier. If the detected input signal characteristic is greater than the small signal threshold level $A_{TH}$, the offset value may be reset to the initial value in step 1274. Return paths 1275 and 1276 are illustrative of a continuing monitoring operation of input (and output) signal amplitude characteristics for dynamically adjusting the offset $K_c$ while the amplifier is operating.

While the processes described above relating to method 1200, and processes of other exemplary methods described below are described and shown as steps, it is to be understood that their order of presentation is for purposes of conceptual understanding and is not intended to specify any particular ordering of steps. For example, steps 1220 and 1210 may be interchanged and some steps, such as steps 1230 and 1240, may be simultaneously performed.

Figure 13:
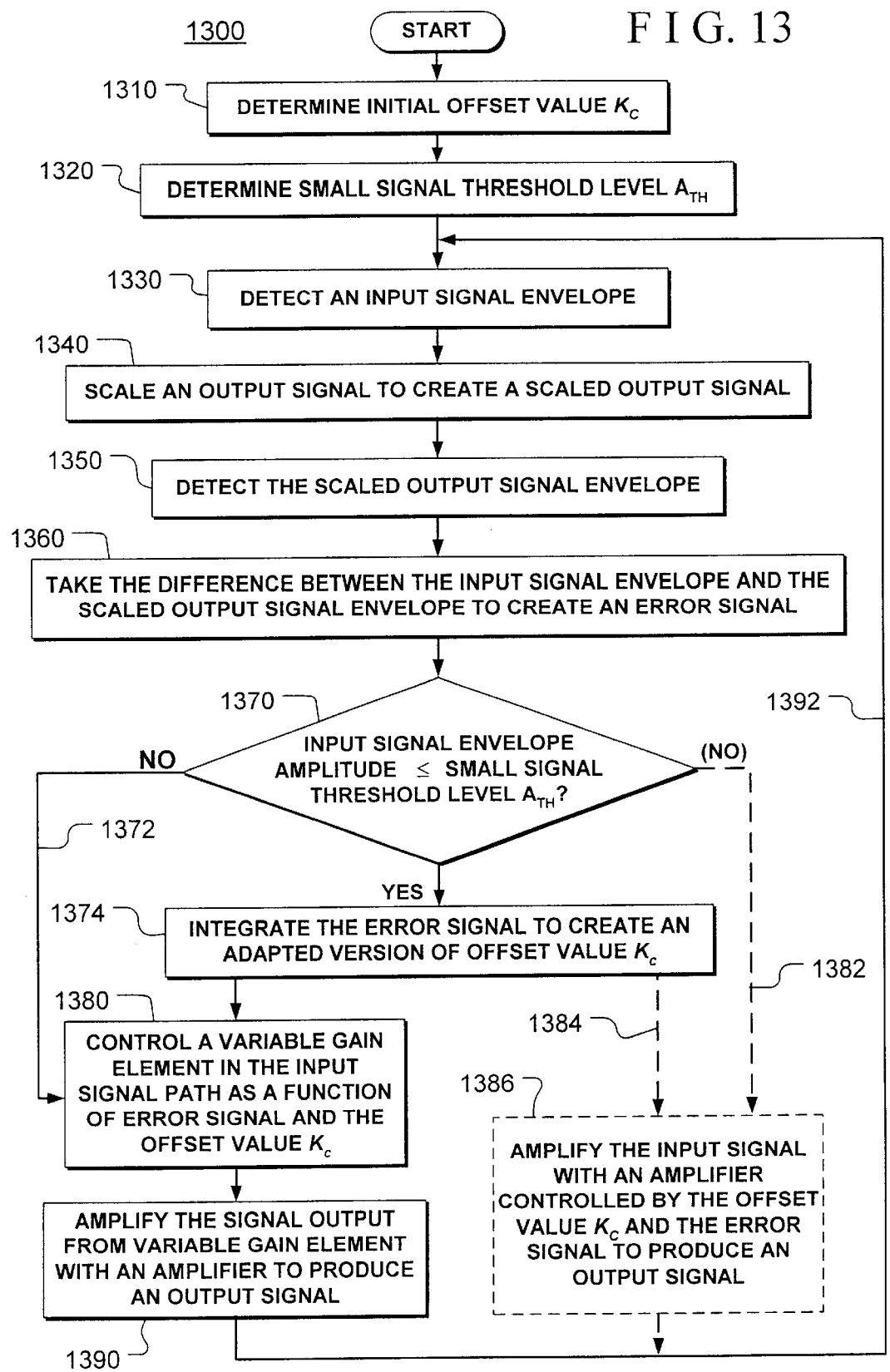
FIG. 13 is a flowchart of an exemplary method of amplifying a signal in accordance with a seventh embodiment of the present invention.

FIG. 13 is a flowchart of an exemplary method 1300 of amplifying a signal in accordance with a seventh embodiment of the present invention. Method 1300 begins in step 1310 when an initial offset value is determined for an amplifying device. For example, the initial $K_c$ may be set equal to the value indicated in equation 6. In step 1320, a threshold level $A_{TH}$ is determined to define a range in which the small signal gain is nonlinear. The input signal envelope is detected in step 1330. The output signal is scaled to create a scaled output signal in step 1340 and the scaled output signal envelope is detected in step 1350. The detection of steps 1330 and 1350 may be carried out with envelope detectors, such as the regular or power envelope detectors 835 and 836, described above. In step 1360, a difference is taken between the input signal envelope and the scaled output signal envelope to create an error signal.

The input signal envelope amplitude is checked to determine whether it is within the small signal threshold range defined by $A_{TH}$ in step 1370. If it is determined that the input amplitude is within the small signal threshold range, e.g., less than or equal to $A_{TH}$, in step 1374 the error signal (from step 1360) is integrated to create an adapted version of offset value $K_c$. A variable gain element in the input signal path is controlled as a function of the error signal and the offset value $K_c$ in step 1380. In this case, the offset value $K_c$ has been derived from the integrated error signal in step 1374. The variable gain element may be a variable gain amplifier, such as variable gain element 824 described above, or another variable gain device. In step 1390, the signal output from the variable gain element is amplified by an amplifier to produce an amplified output signal.

If it is determined in step 1370 that the input signal envelope amplitude is outside a range defined by the small signal threshold level $A_{TH}$, the error signal is not integrated, as represented by the decision path 1372 that bypasses step 1374. Thus, the variable gain element in the input signal path is controlled as a function of the error signal and the offset value $K_c$ determined in step 1310. When the system is powered on, the initial output of the integrator may be set to a value determined, for example, by an initial guess. Thereafter, the system will adapt the value of $K_c$ by itself.

As an alternative to controlling the amplifier with an output of a variable gain element, the input signal may be amplified by an amplifier that is directly controlled by the error signal and offset $K_c$. This is shown by decision path 1382 for the case when an input amplitude resides outside the range defined by the small signal threshold level $A_{TH}$ and path 1384 for the case when an error signal has been integrated. Both of these paths 1382, 1384 are followed by step 1386, in which the input signal is amplified by an amplifier controlled by the offset value (i.e., either initial offset $K_c$ or one derived from the integrated error signal) and the error signal. The amplifier in steps 1386 and 1390 may be a power amplifier (PA), such as the PA 828 described above. Return path 1392 from steps 1390 or 1386 to step 1330 is illustrative of a continuing monitoring operation of input (and output) signal amplitude characteristics for dynamically adjusting the offset $K_c$ while the amplifier is operating.

FIG. 14 is a flowchart of an exemplary method 1400 of amplifying a signal in accordance with an eighth embodiment of the present invention. Method 1400 begins in step 1410 when an initial offset value is determined for an amplifying device. For example the initial $K_c$ may be set equal to the value indicated in equation 6. In step 1420, a threshold level $A_{TH}$ is determined to define a range in which the small signal gain is nonlinear. The input signal envelope is detected in step 1430. The output signal is scaled to create a scaled output signal in step 1440 and the scaled output signal envelope is detected in step 1450. The detection of steps 1430 and 1450 may be carried out with envelope detectors, such as the regular or power envelope detectors 835 and 836, described above. In step 1460, a difference is taken between the input signal envelope and the scaled output signal envelope to create an error signal.

The input signal envelope amplitude is checked to determine whether it is within the small signal threshold range defined by $A_{TH}$ in step 1470. If it is determined that the input amplitude is within the small signal threshold range, e.g., less than or equal to $A_{TH}$, in step 1474 an adapted version of offset value $K_c$ is calculated based on the input amplitude and the sampled scaled output signal envelope. The calculation of $K_c$, for example, may be based on sampling the detected input envelope signal and the detected scaled output signal, calculating a ratio of the two, and from this calculate an adaptive or new value of $K_c$ based on either equation 2 (for a method that detects regular signal envelopes) or equation 8 (for a method that detects scaled power envelopes).

Calculation of new $K_c$ offset values in step 1474 may be performed in a continuous-like fashion by sampling input envelope and scaled output envelope values at equidistant time instances, for example, by using a clock generator with a fixed frequency. Alternatively, new $K_c$ values may be calculated by sampling the input and output envelope values at time instances that are controlled by input signal generating circuitry (not shown) and/or at selected time instances, for example, at points where errors are assumed to be small.

Optionally in step 1474, instead of continuously outputting a new $K_c$ offset value to replace the old value for each sampling interval, an injected $K_c$ value may be based on averaging two or more measurements to finally replace the old value or by calculating a sliding average.

In step 1480, a variable gain element in the input signal path is controlled as a function of the error signal and the offset value $K_c$. In the case when step 1474 is performed, the offset value $K_c$ is the calculated value. The calculation may be performed using a digital signal processor, analog circuitry or a combination of analog and digital circuitry. The variable gain element may be a variable gain amplifier, such as variable gain element 824 described above, or another variable gain device. In step 1490, the signal output from the variable gain element is amplified by an amplifier to produce an amplified output signal.

If it is determined in step 1470 that the input signal envelope amplitude is outside a range defined by the small signal threshold level $A_{TH}$, step 1474 is not performed, as represented in FIG. 14 by the decision path 1472 bypassing step 1474. Thus, the variable gain element in the input signal path is controlled as a function of the error signal and the offset value $K_c$ determined in step 1410.

As an alternative to controlling the amplifier with an output of a variable gain element, the input signal may be amplified by an amplifier that is directly controlled by the error signal and offset $K_c$. This is shown by decision path 1482 for the case when an input amplitude resides outside the range defined by the small signal threshold level ATE, and path 1484 for the case when a new (adaptive) offset value $K_c$ has been calculated. Both of these paths 1482, 1484 are followed by step 1486, in which the input signal is amplified by an amplifier controlled by the offset value (i.e., either initial offset $K_c$ or one derived from the integrated error signal) and the error signal. The amplifier in steps 1486 and 1490 may be a power amplifier (PA), such as the PA 828 described above. Return path 1492 from steps 1490 or 1486 to step 1430 is illustrative of a continuing monitoring operation of input (and output) signal amplitude characteristics for dynamically adjusting the offset $K_c$ while the amplifier is operating.

The adaptive system and method of the present invention allow for extending the linear range of a power amplifier without substantial losses in bandwidth that accompany an increase in the feedback loopgain. Moreover, the amplifier apparatus of the present invention exhibits low distortion and low intermodulation products, and thus permits highly efficient linear operation of a power amplifier. The present invention also makes the envelope feedback schemes self-sufficient without a significant increase in circuit complexity or power consumption because the additional circuitry operates at baseband frequencies.

It will be apparent to those skilled in the art that various changes and modifications can be made in the automatic optimization of linearity for envelope feedback RF amplifier linearization of the present invention without departing from the spirit and scope thereof. Thus, it is intended that the present invention cover the modifications of this invention provided they come within the scope of the appended claims and their equivalents.

What is claimed is:

1. A method of amplifying an input signal, comprising:
    generating an error signal based on an input signal envelope and an output signal envelope;
    determining an amplification level as a function of the error signal and an offset amount;
    amplifying the input signal based on the amplification level; and
    adjusting the offset amount only when an amplitude of the input signal is within a range having an upper limit defined by a predetermined small signal threshold value.

2. The method of claim 1, wherein the step of generating the error signal is based on taking a difference between the output signal envelope and the input signal envelope.

3. The method of claim 1, wherein the step of adjusting the offset amount includes integrating the error signal.

4. The method of claim 1, wherein the step of adjusting the offset amount comprises:
    sampling the output signal envelope to obtain a sampled output envelope value; and
    calculating the adjusted offset amount such that a gain of an amplifier is substantially constant across a range of input signal amplitude values including the predetermined small signal threshold value and values greater and smaller than the predetermined small signal threshold value.

5. The method of claim 4, further comprising sampling the input signal envelope to obtain the amplitude of the input signal.

6. The method of claim 4, further comprising obtaining the input signal amplitude from input signal generating circuitry prior to the step of calculating the adjusted offset value.

7. The method of claim 1, further comprising averaging a plurality of calculated adjusted offset values to generate the adjusted offset amount.

8. The method of claim 1, further comprising:
    modifying an amplifying process of the amplifier apparatus as a function of the error signal and the offset amount.

9. The method of claim 8, wherein the step of modifying the amplifying process comprises:
    modifying a control signal based on a sum of the error signal and a current offset amount; and
    controlling a variable gain element in an input signal path based on the modified control signal.

10. The method of claim 9, further comprising amplifying and lowpass filtering the error signal prior to the step of summing the error signal and the offset amount.

11. The method of claim 8, wherein the step of modifying the amplifying process comprises:
    summing the error signal and an adjusted offset amount to generate an adjusted control signal; and
    controlling the amplifier power supply or operating point based on the adjusted control signal.

12. The method of claim 11, further comprising amplifying and lowpass filtering the error signal prior to the step of summing the error signal and the adjusted offset amount.

13. An amplifier apparatus, comprising:
    a power amplifier having an input signal path and an output node, the power amplifier configured to produce an output signal on the output node in response to receiving an input signal on the input signal path;
    a feedback loop configured to produce a feedback signal in response to the input signal and the output signal, wherein the feedback signal is a function of the input signal, the output signal and an offset signal and wherein the feedback signal in conjunction with the input signal controls an output level of the power amplifier;
    an offset signal circuit that generates the offset signal; and
    wherein the offset signal circuit is configured to output a constant predetermined offset signal value when the amplitude of the input signal is above a predetermined small signal threshold level, and to output an adaptive offset signal when the amplitude of the input signal is at or below the predetermined small signal threshold level.

14. The amplifier apparatus of claim 13, wherein the adaptive offset signal has a level that varies in response to changes in the amplitudes of the coupled input and output signals.

15. The amplifier apparatus according to claim 13, wherein the feedback loop comprises:
    a first envelope detector for detecting an input signal envelope of the input signal;
    a second envelope detector for detecting an output signal envelope of the output signal;
    a differencing circuit coupled to an output of the first envelope detector and an output of the second envelope detector and configured to output an error signal indicative of a difference between the input signal envelope and output signal envelope.

16. The amplifier apparatus according to claim 15, wherein:
    the offset signal circuit comprises an integrator having an input node configured to receive the error signal and an output node configured to output an integration of the error signal, wherein the adaptive offset signal is a function of the integrated error signal; and
    the feedback loop comprises a summing circuit configured to add the offset signal to the error signal.

17. The amplifier apparatus according to claim 16, wherein the integrator outputs the adaptive offset signal to the summing circuit only in response to receiving an enable signal.

18. The amplifier apparatus according to claim 17, wherein the enable signal is generated in baseband circuitry of a transmitter.

19. The amplifier apparatus according to claim 17, wherein the offset signal circuit further comprises:
a comparator configured to compare the detected input signal envelope with the predetermined small signal threshold level, wherein the comparator generates the enable signal when the detected input signal envelope is at or below the small signal threshold level.

20. The amplifier apparatus according to claim 16, wherein the offset signal circuit further comprises:
a first limiting circuit configured to receive the detected input signal envelope;
a second limiting circuit configured to receive the detected output signal envelope; and
a differencing circuit configured to determine a difference between outputs of the first and second limiting circuits and to output the difference signal to the input node of the integrator.

21. The amplifier apparatus according to claim 20, wherein a gain of each of the first and second limiting circuits cause the first and second limiting circuits to saturate when the amplitudes of the detected input signal envelope and the detected output signal envelope are greater than the small signal threshold level.

22. The amplifier apparatus according to claim 21, wherein the gain of the first limiting circuit is substantially equal to a gain of the second limiting circuit.

23. The amplifier apparatus according to claim 16, wherein the feedback loop further comprises at least one DC nulling circuit provided between the integrator and either the first envelope detector or the second envelope detector such that the at least one DC nulling circuit removes DC offsets in the error signal.

24. The amplifier apparatus according to claim 15, wherein the offset signal circuit further comprises:
a signal processor configured to receive a signal indicative of the input signal amplitude level and a sampled value of the detected output signal envelope and to calculate the adaptive offset signal value such that a gain of the power amplifier remains substantially constant across a range of the input signal amplitude levels, wherein the range includes input signal amplitude levels greater and smaller than the small signal threshold level.

25. The amplifier apparatus according to claim 24, further comprising:
a first sampling circuit configured to sample and output a digitized value of the detected output signal envelope; and
a second sampling circuit coupled to the output of the first envelope detector and configured to sample and output a digitized value of the detected input signal envelope, wherein the signal indicative of the input signal amplitude level is provided from the second sampling circuit.

26. The amplifier apparatus according to claim 15, wherein the input signal path comprises a variable gain amplifier having an output coupled with the input of the power amplifier, wherein the feedback signal controls the variable gain amplifier.

27. An amplifier apparatus for amplifying an input signal, comprising:
means for generating an error signal based on an input signal envelope and an output signal envelope;
means for determining an amplification level as a function of the error signal and an offset amount;
means for amplifying the input signal based on the amplification level; and
means for adjusting the offset amount only when an amplitude of the input signal is within a range having an upper limit defined by a predetermined small signal threshold value.

28. The amplifier apparatus according to claim 27, wherein the means for generating the error signal comprises means for determining a difference between the output signal envelope and the input signal envelope.

29. The amplifier apparatus according to claim 27, wherein the means for adjusting the offset amount includes means for integrating the error signal.

30. The amplifier apparatus according to claim 27, wherein the means for adjusting the offset amount comprises:
means for calculating the adjusted offset amount such that a gain of an amplifier is substantially constant across a range of input signal amplitude values including the predetermined small signal threshold value and values greater and smaller than the predetermined small signal threshold value.

31. The amplifier apparatus according to claim 30, wherein the means for adjusting the offset amount further comprises:
means for sampling the output signal envelope to obtain a sampled output envelope value; and
means for sampling the input signal envelope to obtain the amplitude of the input signal.

32. The amplifier apparatus according to claim 30, further comprising means for averaging a plurality of calculated adjusted offset values to generate the adjusted offset amount.

33. The amplifier apparatus according to claim 27, wherein the means for determining an amplification level comprises a variable gain element.

34. The amplifier apparatus according to claim 27, further comprising means for amplifying the error signal coupled between the means for generating an error signal and the means for determining the amplification level.

35. The amplifier apparatus according to claim 27, further comprising means for filtering the error signal coupled between the means for generating an error signal and the means for determining the amplification level.

36. The amplifier apparatus according to claim 27, wherein the means for determining an amplification level further comprises means for summing the error signal and an adjusted offset amount.

* * * * *